US005273929A

United States Patent [19]
Hirtz et al.

[11] Patent Number: 5,273,929
[45] Date of Patent: Dec. 28, 1993

[54] METHOD OF MANUFACTURE TRANSISTOR HAVING GRADIENT DOPING DURING LATERAL EPITAXY

[75] Inventors: Jean-Pierre Hirtz, l'Haye les Roses; Didier Pribat, Sevres, both of France

[73] Assignee: Thomson-CSF, Puteaux, France

[21] Appl. No.: 747,013

[22] Filed: Aug. 19, 1991

[30] Foreign Application Priority Data

Aug. 24, 1990 [FR] France .................. 90 10629

[51] Int. Cl.[5] .................................. H01L 21/20
[52] U.S. Cl. ............................ 437/89; 437/128; 148/DIG. 126
[58] Field of Search ............. 437/89, 912, 128, 129, 437/90

[56] References Cited

U.S. PATENT DOCUMENTS

| | | | |
|---|---|---|---|
| 4,211,586 | 7/1980 | Fang et al. | 437/128 |
| 4,253,229 | 3/1981 | Yeh et al. | 437/39 |
| 4,769,341 | 9/1988 | Luryi | 437/128 |
| 4,907,053 | 3/1990 | Ohmi | 357/23.1 |
| 4,948,752 | 8/1990 | Geissberger et al. | 437/128 |
| 4,952,526 | 8/1990 | Pribat et al. | 437/89 |
| 4,999,314 | 3/1991 | Pribat et al. | 437/89 |
| 5,213,995 | 5/1993 | Chen et al. | 437/128 |

FOREIGN PATENT DOCUMENTS

| | | |
|---|---|---|
| 0073487 | 3/1983 | European Pat. Off. . |
| 0098111 | 1/1984 | European Pat. Off. . |
| 0241316 | 10/1987 | European Pat. Off. . |
| 0281335 | 9/1988 | European Pat. Off. . |
| 0336831 | 10/1989 | European Pat. Off. . |

OTHER PUBLICATIONS

Extended Abstracts of the 19th Conference on Solid State Devices and Materials, Aug. 25-27, 1987, pp. 179-182, K. Kusukawa, et al., "MOS-FETs Fabricated By SPE-SOI Technology".

Primary Examiner—Olik Chaudhuri
Assistant Examiner—Long Pham
Attorney, Agent, or Firm—Oblon, Spivak, McClelland, Maier & Neustadt

[57] ABSTRACT

A power transistor comprises, on a layer of insulator, a layer of a semiconductor material comprising several zones with N+, N and N+ doping. The N doped zone corresponds to the gate zone. The N+ doped zones correspond to the drain and source zones. A method for the making of such a transistor is also disclosed. Application: the making of a field-effect transistor with improved heat dissipation.

4 Claims, 4 Drawing Sheets

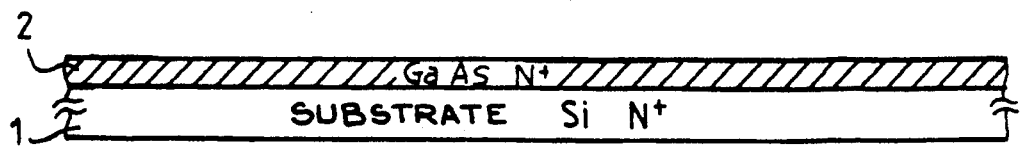
FIG_1
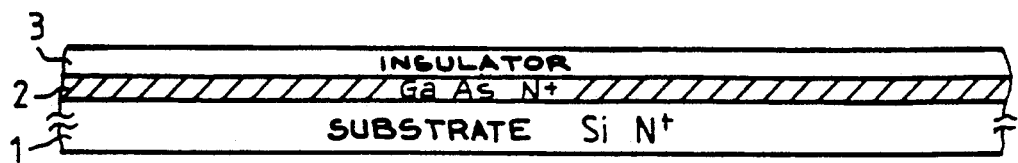
FIG_2
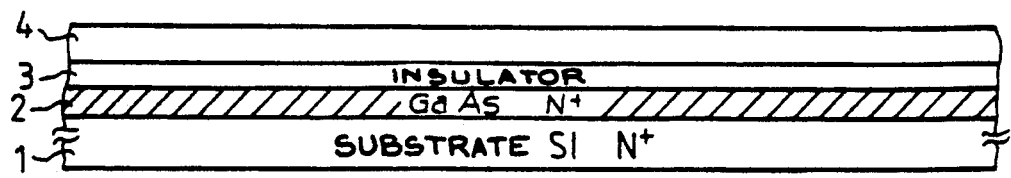
FIG_3
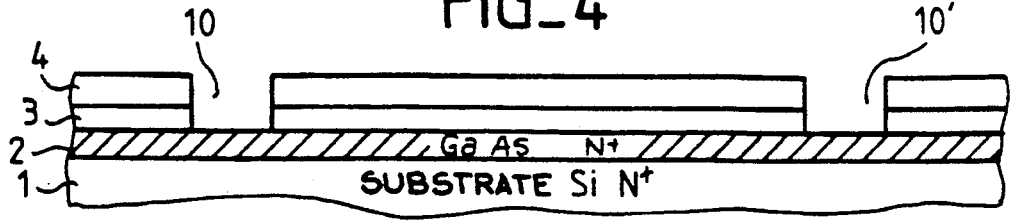
FIG_4
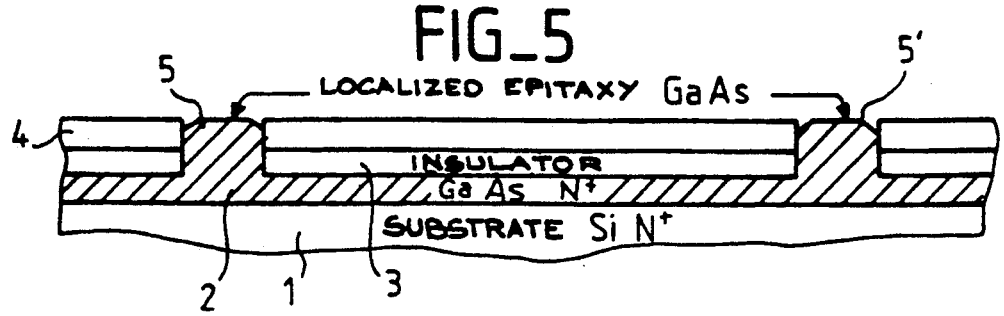
FIG_5

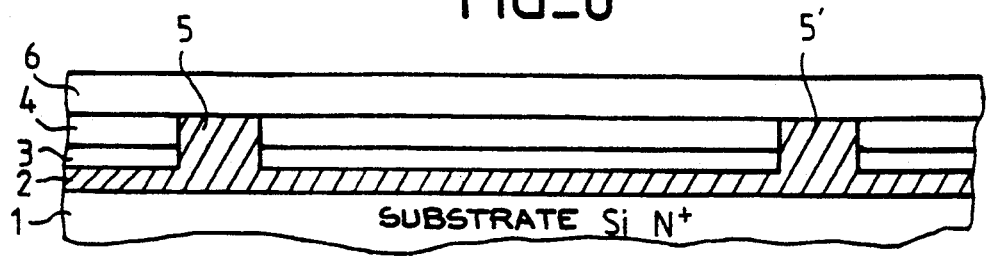
FIG_6
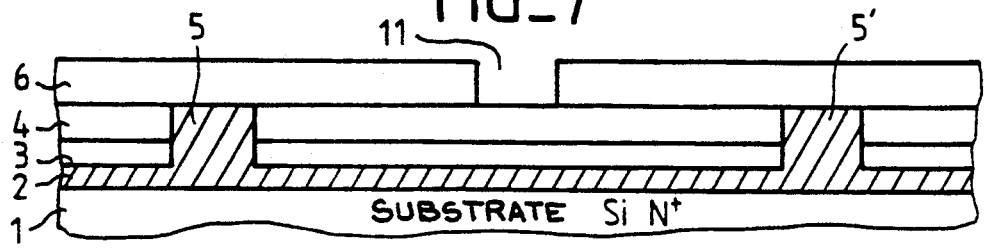
FIG_7
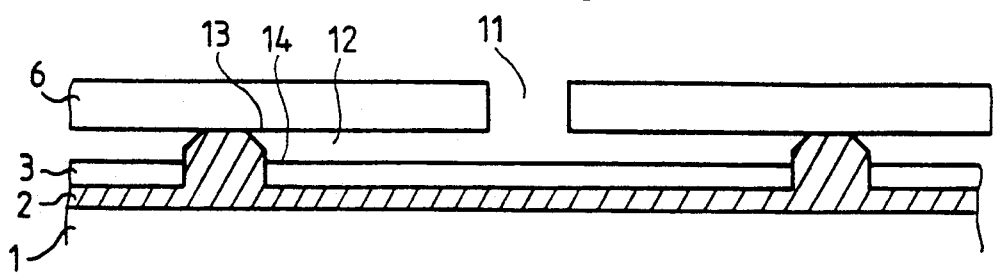
FIG_8
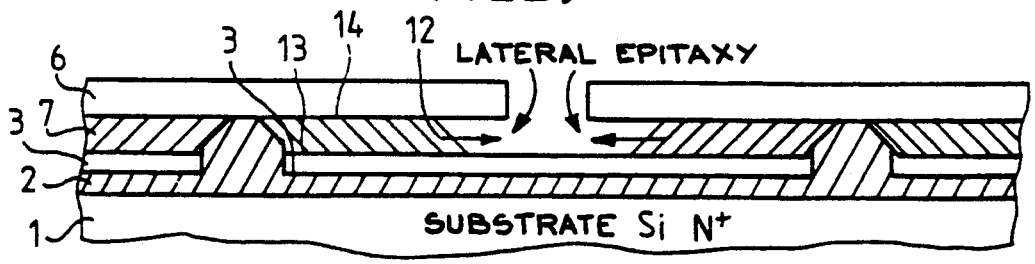
FIG_9
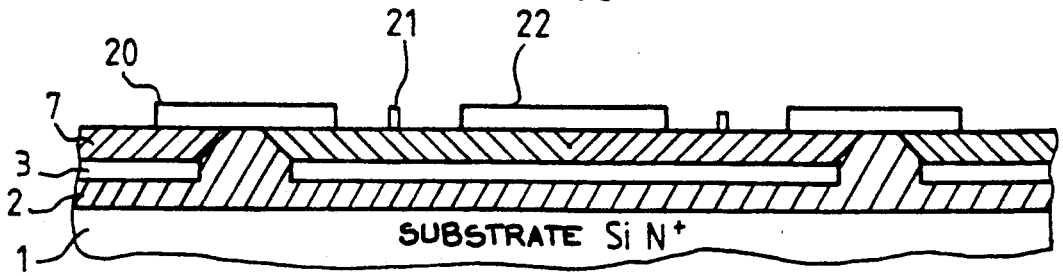
FIG_10

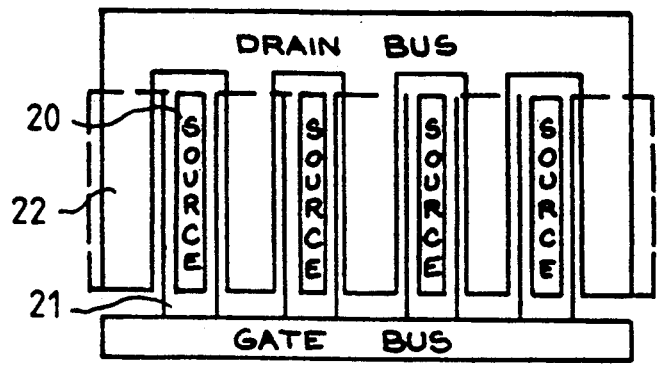
FIG_11
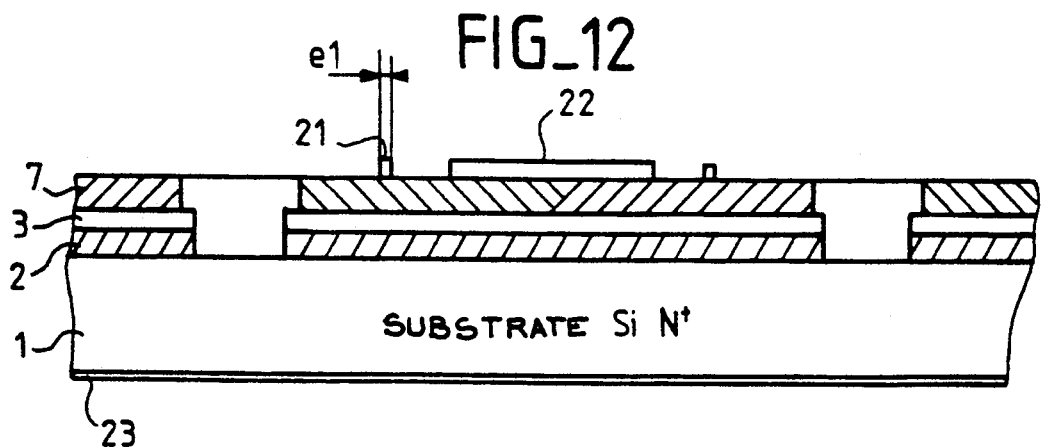
FIG_12
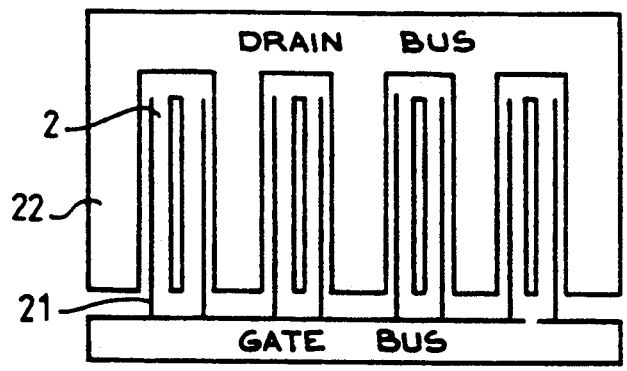
FIG_13

FIG_14
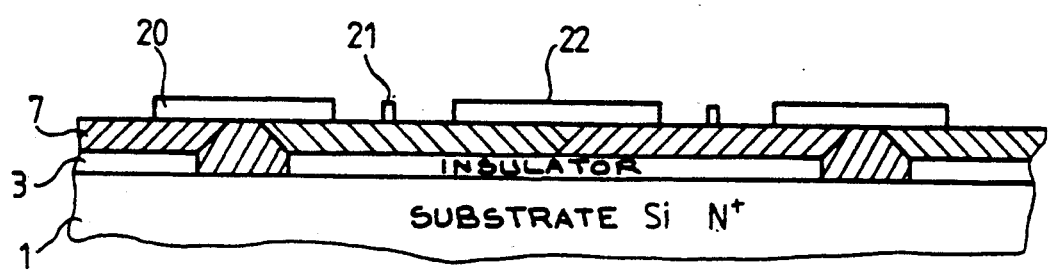
FIG_15
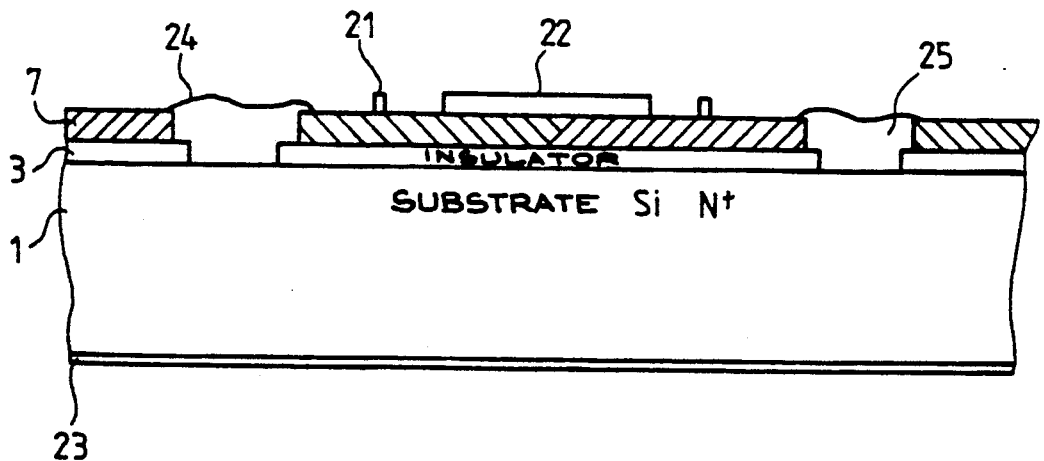

METHOD OF MANUFACTURE TRANSISTOR HAVING GRADIENT DOPING DURING LATERAL EPITAXY

BACKGROUND OF THE INVENTION

The invention relates to a power transistor and to a method of its manufacture. It can be applied to the manufacture of transistors made of semiconductor materials of a given type, made on a substrate of a different type, for example a transistor made of III-V material such as GaAs on a silicon substrate.

The epitaxial growth of GaAs on silicon offers major technological prospects in the field of power components.

The electrical performance values of transistors made of GaAs or III-V materials are well-known, but it is also known that gallium arsenide is costly and brittle, and that it is a poor conductor of heat. By contrast, silicon is relatively economical, less brittle and conducts heat well, but silicon transistors have electrical performance characteristics that are limited in frequency.

This opposition between the characteristics of GaAs and silicon has recently led to the making of the transistors in GaAs layer epitaxiated on a Si substrate: the transistor has the performance values of GaAs. It costs less in terms of semiconductor material, and the Si wafer is less brittle: hence the efficiency is greater.

This approach is promising for small-sized, low-noise transistors which dissipate little heat at the channel. It is hard to apply the approach to power transistors that dissipate more heat: for a transistor delivering one watt at the millimetrical frequencies, the region of the channel dissipates three watts. Now, the channel of the transistor always lies on an electrical semi-insulator layer, to prevent the current from leaking towards the Si substrate which is always electrically conductive: at best, it is highly resistive, for there is no known way of making electrically insulating Si. This layer of electrically insulating GaAs therefore also forms a heat barrier that counters the removal of the heat through the substrate Si.

According to a known technique for a GaAs transistor, on a GaAs substrate (made in a bulk structure), the heat is removed by the rear face, by means of holes that cross the entire thickness of the body of the transistor, and are filled with a metal. However, these holes are made at the cost of having to employ a complicated method to bond the wafer by its front face, or upper face, to a support, and then having to grind the GaAs substrate which is practically replaced by a metal heat sink, most usually made of gold.

With a "rear face" technology such as this, which is complicated to implement, the efficiency values obtained are often low (less than 50%).

Furthermore, it is difficult to adapt this technology to GaAs/Si transistors.

According to another known technique, one of the two regions providing access to the transistor, namely the source and the drain, is provided with a metallic heat well that goes through the GaAs layer or layers to come into contact with the silicon substrate and that also conducts the heat released in operation towards the silicon substrate which is a better heat conductor and dissipates the heat. However, this technique calls for a thick buffer layer of GaAs between the Si substrate and the active layer of GaAs. Thus, a significant part of the advantage given by the heat dissipation of the silicon is lost.

Finally, this technology of the GaAs/Si transistor makes it necessary to drill the GaAs layer at the center of the source contact, so as to interconnect the sources through the very highly doped Si substrate. This so-called via-hole technology is relatively difficult to implement for a GaAs/Si structure.

The invention proposes a transistor structure different from known structures and a manufacturing method.

With respect to the manufacturing method, the French patent applications Nos. 88 04 437 and 88 04 438 describe a method of growing a layer of semiconductor material of a given type (GaAs for example), on another semiconductor (silicon for example), without defects.

Furthermore, the layer may have a modulation of doping along the plane of the layer as described in the French patent application No. 89 04 257.

SUMMARY OF THE INVENTION

The invention therefore relates to a transistor, comprising:
  on a substrate, at least one zone covered with a layer of an insulator material and, joined to this zone, at least one element made of semiconductor material with high doping of a determined type;
  on the layer of insulator material, at least one layer of semiconductor material comprising three aligned parts: a first highly doped part that touches the element made of semiconductor material, a second intermediate part doped in the same way as the first part but more weakly so, a third part that is opposite the first part in relation t the second part and is highly doped with the same type of doping as the first part;
  source and drain contacts located on the first and third parts, and a gate contact located on the second part.

The invention also relates to a method for the making of at least one transistor, wherein said method comprises the following different steps:
  a) the making of a cavity contained between two layers and defined by a first face and a second face, that are parallel, of these layers, said cavity including, in its thickness, at least one element made of a semiconductor material as well as an aperture going through one of the layers and ending substantially perpendicularly to one of the parallel faces, said layers being made of a material such that there can be neither nucleation nor deposition of semiconductor;
  b) the epitaxy, through said aperture, of a material of the same type as that of said element so a to fill the cavity, the epitaxiated material being highly doped in a first part at the start of the epitaxy and then weakly doped in a second part and, finally, highly doped in a third part at the end of epitaxy;
  c) the removal of the layer comprising the aperture;
  d) the making of a source contact on the first part of the epitaxiated material, a gate contact on the second part of the epitaxiated material and a drain contact on the third part of the epitaxiated material.

BRIEF DESCRIPTION OF THE DRAWINGS

The different objects and features of the invention shall appear more clearly from the following description and from the appended drawings, of which:

FIGS. 1 to 10 exemplify a manufacturing method according to the invention;

FIG. 11 shows an arrangement of a set of transistors according to the invention;

FIGS. 12 to 15 show variants of the transistor according to the invention.

DETAILED DESCRIPTION OF THE INVENTION

Referring to FIGS. 1 to 10, we shall first of all describe a manufacturing method according to the invention.

This method comprises the following different steps:

STEP 1

On a layer 1 of highly doped silicon, a very highly doped layer of GaAs is epitaxiated, for example by MBE or MOCVD. A layer 2 of doped GaAs (FIG. 1) is obtained.

STEP 2

A first mask (layer 3) of insulator material is deposited on this layer 2. It is important that this mask should be a good heat conductor for the heat dissipation of the power MESFET. This mask could, for example, by made of polycrystalline $Al_2O_3$ or polycrystalline BeO or polycrystalline diamond or AlN (FIG. 3).

STEP 3

A second mask (layer 4) is deposited on the layer 3. This mask should have high selectivity of chemical attack as compared with the first mask. It may be made of amorphous silicon for example (FIG. 3).

STEP 4

Localized apertures 10, 10' are made in the two masks (layers 3 and 4) up to the GaAs surface (FIG. 4).

STEP 5

A localized and selective epitaxy of highly doped GaAs is made in these apertures. This is, for example, a chlorides-based vapor phase epitaxy. The surface of this localized deposit of GaAs should be flush with the surface of the second mask. Thus, the elements 5, 5' made of highly doped GaAs are obtained in the apertures 10, 10'.

STEP 6

A third mask (layer 6) is deposited on the entire surface of the elements 5, 5' and layer 4. This third mask should have high selectivity of attack as compared with the second mask. It is made of $Si_3N_4$ for example (FIG. 6).

STEP 7

One aperture 11 at least is made in the third mask, through selective attack with respect to the second mask. This aperture is made midway between the elements 5, 5' (see FIG. 7).

STEP 8

The second mask (layer 4) is entirely attacked and eliminated by means of a selective attack with respect to the first and third masks. Thus, as is shown in FIG. 8, a cavity 12 devoid of any material is obtained beneath the layer 6.

STEP 9

The active zone of the transistor to be manufactured is then made by lateral epitaxy according to the methods described in the French patent applications Nos. 88 04 437 and 88 04 438. The GaAs elements 10, 10', deposited during the preceding step 5, act as growth seeds for the epitaxy of GaAs within the cavity 12. The growth defects get localized in the region close to the seed (element 5, 5'). For, they are confined by the two interfaces 13 and 14 of the cavity 12. This lateral epitaxy further offers the possibility of a modulation of doping. To this end, as is described in the patent application No. 89 04 257, a dopant gas is introduced during the epitaxial operation so as to dope the material epitaxiated in the cavity 12. The doping is done in such a way that, at the start of the epitaxy, an N+ doping is obtained and then, by the reduction of the partial pressure of the gas in the epitaxy reactor, an N doping is obtained, then again an N+ doping is obtained by again raising the partial pressure of the gas. Thus, a structure formed by a plane layer 7 possessing a lateral modulation would be well suited to the source-gate-drain regions of a MESFET (FIG. 9).

STEP 10

After the removal of the third mask (layer 6) by chemical attack, a very simplified procedure for the making of the power MESFET will be carried out. In particular, the critical step of the via hole used for the interconnection of the sources will be eliminated. The source contacts 20 will be made by means of N+ GaAs, which is used as a seed for the lateral epitaxy. The source contacts (which will enable the lateral access resistances to be reduced and the underlying GaAs to be short-circuited) will be deposited directly on the adjacent seed zones and regions. The gate and drain contacts 21 and 22 are defined on the material deposited by lateral epitaxy. In particular, the gate contacts 21 will be made on the N doped intermediate zones. The drain contacts 22 will be made on the N+ doped zones, located near the position of the apertures 11 (see FIG. 10). One drain contact 22 may be common to two transistors. The MESFET technology thus achieved is an entirely front-face technology. Furthermore, the critical step of the via hole is thus eliminated (FIG. 11). The hardening of this MESFET to radiation will be enhanced by the semiconductor-on-insulator character of the structure.

As can be seen in FIG. 11, the method of the invention can be used to make several transistors in one and the same plane, the interconnection of the drains and gates being obtained easily and the interconnection of the sources being obtained by the Si substrate.

According to one variant of the invention, shown in FIGS. 12 and 13, reactive ion etching (RIE) is used to remove the defective GaAs, namely the seeds 5 and 5' and the immediately adjacent regions and, by using the same mask, this material is replaced by two contacts (24, 25) during a "lift-off" type of operation.

According to the above exemplary method of manufacture, provision was made, during the first step, for making an epitaxiated layer of highly doped GaAs by MBE or MOCVD.

However, according to one variant of the invention, this first step is not performed. The layer 3 of insulator is then made directly on the substrate, and the other steps of the method are carried out as described here above. As described in the patent application No. 88 04 438, the dislocations that occur following the epitaxy of the GaAs elements 5 and 5' on the silicon substrate are reduced or even stopped by the faces 13 and 14 of the two layers 3 and 6. Thus a structure such as the one shown in FIG. 14 is obtained. FIG. 15 further represents a variant of the exemplary embodiments shown in FIGS. 12 to 14. This variant has no layer 2 of GaAs and, instead of the elements 5, 5', it has contacts 24, 25.

By way of an example, the thickness of each of the above preceding layers 2, 3, 4, 6 and, notably, the thickness of the cavity 12, range between 0.1 and 1 micrometer. The width of the gate, referenced el in FIG. 12, is about 0.1 to 1 micrometer. The spacing between the source and the drain (between 22 and 24) is about 10 to 100 micrometers.

The following are the chief advantages of the present invention:
- the active layer of the MESFET GaAs/Si has a far smaller density of dislocations;
- the heat dissipation is improved;
- the hardening is improved;
- the method used to make the MESFET is very substantially simplified.

The above description has been given purely by way of an example, and other variants may be contemplated without going beyond the scope of the invention. In particular, we have described the making of a GaAs transistor made on a silicon substrate, but the use of other semiconductor materials could be envisaged. In the same way, examples may be envisaged where the substrate and the transistor are both made with one and the same semiconductor material.

What is claimed is:

1. A method for the manufacture of at least one transistor, wherein said method comprises the following different steps:
   a) the making of a cavity contained between two layers and defined by a first face and a second face, that are parallel, of these layers, said cavity including, in its thickness, at least one element made of a semiconductor material as well as an aperture going through one of the layers and ending substantially perpendicularly to one of the parallel faces, said layers being made of a material such that there can be neither nucleation nor deposition of semiconductor;
   b) the lateral epitaxy, through said aperture, of a material of the same type as that of said element so as to fill the cavity, the epitaxiated material being highly doped in a first part at the start of the epitaxy and then weakly doped in a second part and, finally, highly doped in a third part at the end of epitaxy;
   c) the removal of the layer comprising the aperture;
   d) the making of a source contact on the first part of the epitaxiated material, a gate contact on the second part of the epitaxiated material and a drain contact on the third part of the epitaxiated material.

2. A method according to claim 1, wherein one of the layers forming the cavity as well as the element made of doped semiconductor material are located on the surface of a substrate made of a highly doped semiconductor material and the source contact is made on the substrate.

3. A method according to claim 1, wherein the making of the cavity is preceded by the making of a layer of semiconductor material and wherein the layer determining the cavity and having no aperture is made on the layer of semiconductor material.

4. A method according to either of the claims 1 or 3 comprising, after the lateral epitaxy step, a step for the etching of said element and a step for the deposition, in the location thus etched, of contacts.

* * * * *